United States Patent
Sukurai et al.

(10) Patent No.: US 7,605,564 B2
(45) Date of Patent: Oct. 20, 2009

(54) BATTERY PACK AND RESIDUAL CAPACITY INFORMATION FEEDING DEVICE INCLUDING RESIDUAL CAPACITY CORRECTION UNIT

(75) Inventors: Masaki Sukurai, Tokyo (JP); Yukio Tsuchiya, Kanagawa (JP)

(73) Assignee: Sony Corporation, Tokyo (JP)

( * ) Notice: Subject to any disclaimer, the term of this patent is extended or adjusted under 35 U.S.C. 154(b) by 328 days.

(21) Appl. No.: 11/709,748

(22) Filed: Feb. 23, 2007

(65) Prior Publication Data
US 2007/0216365 A1 Sep. 20, 2007

(30) Foreign Application Priority Data
Mar. 6, 2006 (JP) .............................. 2006-059309

(51) Int. Cl.
*H01M 10/46* (2006.01)
(52) U.S. Cl. ..................................................... 320/132
(58) Field of Classification Search ................. 320/107, 320/112, 132, 149, 150; 324/426, 430, 433, 324/434
See application file for complete search history.

(56) References Cited

U.S. PATENT DOCUMENTS

| | | | | |
|---|---|---|---|---|
| 5,598,087 | A * | 1/1997 | Hara | 320/DIG. 21 |
| 6,160,380 | A * | 12/2000 | Tsuji et al. | 320/132 |
| 6,313,606 | B1 * | 11/2001 | Eguchi | 320/132 |
| 6,930,465 | B2 * | 8/2005 | Kishi et al. | 320/132 |

FOREIGN PATENT DOCUMENTS

| | | |
|---|---|---|
| JP | 9-297166 | 11/1997 |
| JP | 2005-147815 | 6/2005 |

\* cited by examiner

*Primary Examiner*—Edward Tso
(74) *Attorney, Agent, or Firm*—Finnegan, Henderson, Farabow, Garrett & Dunner, L.L.P.

(57) ABSTRACT

A battery residual capacity information feeding device is disclosed. The device includes: residual capacity holding means for holding the battery residual capacity of a battery pack; temperature measuring means for measuring a temperature in the battery pack; and residual capacity correcting means for generating a correction quantity of the battery residual capacity on the basis of the temperature and the battery residual capacity, to feed the battery residual capacity corrected with the correction quantity.

8 Claims, 6 Drawing Sheets

FIG. 4

UNIT CORRECTION QUANTITY TABLE

410

| TEMPERATURE \ RESIDUAL CAPACITY | LESS THAN HALF | HALF OR MORE |
|---|---|---|
| 60°C OR HIGHER | UNIT CORRECTION QUANTITY A | UNIT CORRECTION QUANTITY E |
| LOWER THAN 60°C AND 45°C OR HIGHER | UNIT CORRECTION QUANTITY B | UNIT CORRECTION QUANTITY F |
| LOWER THAN 45°C AND 25°C OR HIGHER | UNIT CORRECTION QUANTITY C | UNIT CORRECTION QUANTITY G |
| LOWER THAN 25°C | UNIT CORRECTION QUANTITY D | UNIT CORRECTION QUANTITY H |

FIG. 5

NORMALIZED CORRECTION QUANTITY TABLE

420

| ACCUMULATED CORRECTION QUANTITY | NORMALIZED CORRECTION QUANTITY |
|---|---|
| LESS THAN i | NORMALIZED CORRECTION QUANTITY I |
| LESS THAN j | NORMALIZED CORRECTION QUANTITY J |
| LESS THAN k | NORMALIZED CORRECTION QUANTITY K |
| LESS THAN l | NORMALIZED CORRECTION QUANTITY L |
| LESS THAN m | NORMALIZED CORRECTION QUANTITY M |
| LESS THAN n | NORMALIZED CORRECTION QUANTITY N |
| LESS THAN o | NORMALIZED CORRECTION QUANTITY O |
| LESS THAN p | NORMALIZED CORRECTION QUANTITY P | ically related to a battery pack and, more particularly, to a battery pack for outputting a battery residual capacity to the outside, and a processing method therefor and a program for causing a computer to execute the method.

BATTERY PACK AND RESIDUAL CAPACITY INFORMATION FEEDING DEVICE INCLUDING RESIDUAL CAPACITY CORRECTION UNIT

CROSS REFERENCES TO RELATED APPLICATIONS

The present invention contains subject matter related to Japanese Patent Application JP 2006-059309 filed in the Japanese Patent Office on Mar. 6, 2006, the entire contents of which being incorporated herein by reference.

BACKGROUND OF THE INVENTION

1. Field of the Invention

The present invention relates to a battery pack and, more particularly, to a battery pack for outputting a battery residual capacity to the outside, and a processing method therefor and a program for causing a computer to execute the method.

2. Background Art

A battery pack is used for feeding an electric power to an electronic device such as a video camera. This battery pack is provided with a charging battery (or a secondary battery) such as a lithium ion cell, a nickel-cadmium cell or a nickel-hydrogen cell, and is repeatedly utilized by charging it. This battery pack is so realized as has a function to output a battery residual capacity (or an accumulated discharge current residue) or the like.

For example, there has been proposed (as referred to JP-A-9-297166 (FIG. 1) (Patent Document 1), for example) a technique, in which a battery residual capacity, a current or a voltage in the battery pack is outputted to an electronic device so that the residual time period of the battery is accordingly calculated on the side of the electronic device. For calculating the residual time period of the battery on the side of the electronic device, there are demanded parameters, which depend upon a battery cell and which are set at the time of shipping the battery pack. The electronic device is enabled to calculate the residual time period of the battery at the unit of minute by receiving those parameters.

It is known that the battery pack has its battery capacity reduced due to deterioration so that its available time period is shortened. As the factors for this deterioration of the battery, there can be enumerated the cycle deterioration due to the repetitions of charging/discharging operations and the influences of the temperature around the battery. In the related art, therefore, there has been proposed (as referred to JP-A-2005-147815 (FIG. 1) (Patent Document 2), for example) a technique, in which the battery residual capacity is corrected considering the cycle deterioration of the battery pack and the temperature at the time of using the battery, so that the battery residual capacity corrected is outputted from the battery pack to the electronic device.

SUMMARY OF THE INVENTION

In the related art thus far described, the temperature at the time of using the battery pack is measured, and the battery residual capacity is corrected from the relation between the using temperature and the number of charging/discharging operations. However, the deterioration of the battery can proceed not only when the battery is used but also when the battery is not used but stored. In order to feed the information on the more precise battery residual capacity, therefore, it is necessary to make a correction considering the storage environment of the battery pack.

Therefore, it is desired to make a correction taking the storage environment of a battery pack into account when the information on the battery residual capacity is to be fed.

According to a first embodiment of the invention, there is provided a battery residual capacity information feeding device including: residual capacity holding means for holding the battery residual capacity of a battery pack; temperature measuring means for measuring a temperature in the battery pack; and residual capacity correcting means for generating a correction quantity of the battery residual capacity on the basis of the temperature and the battery residual capacity, to feed the battery residual capacity corrected with the correction quantity. As a result, the correction considering the storage environment of the battery pack is executed, when the battery residual capacity is fed.

According to this first embodiment, moreover, the battery residual capacity information feeding device may further include a unit correction quantity table for holding the correction quantity of the battery residual capacity per unit time in accordance with the temperature and the battery residual capacity, as a unit correction quantity, and the residual capacity correcting means may acquire the unit correction quantity by referring to the unit correction quantity table on the basis of the temperature and the battery residual capacity, thereby to use the acquired unit correction quantity as the correction quantity of the battery residual capacity. As a result, the unit correction quantity according to the battery characteristics is set in the unit correction quantity table thereby to acquire the unit correction quantity according to the storage environment of the battery pack.

According to this first embodiment, moreover, the battery residual capacity information feeding device may further include time measuring means for measuring the unit time, and the residual capacity correcting means may perform the correction of the battery residual capacity each time the unit time is measured by the time measuring means. In this case, the residual capacity correcting means may shift to an idle state under a predetermined condition and release the idle state each time the unit time is measured by the time measuring means to perform the correction of the battery residual capacity each time the unit time is measured by the time measuring means. As a result, the correction of the battery residual capacity is executed without activating a micro controller or the like in the battery pack always.

According to this first embodiment, moreover, in the unit correction quantity table, it may be set that the unit correction quantity is the larger as the battery residual capacity is the higher, if the temperature is equivalent, and that the unit correction quantity is the larger as the temperature is the higher, if the battery residual capacity is equivalent.

According to this first embodiment, moreover, the battery residual capacity information feeding device may further include: accumulated correction quantity holding means for accumulating the unit correction quantities acquired by the residual capacity correcting means, to hold the accumulated unit correction quantities as an accumulated correction quantity; and a normalized correction quantity table for holding the normalized correction quantities of the battery residual capacities as the normalized correction quantity in accordance with the accumulated correction quantity, and the residual capacity correcting means may acquire the normalized correction quantity by referring to the normalized correction quantity table on the basis of the accumulated correction quantity, to use the acquired normalized correction quantity as the correction quantity of the battery residual capacity. As a result, the correction of the battery residual capacity is executed by the normalized correction quantity, which is stepwise normalized from the accumulated correction quantity.

According to a second embodiment of the invention, moreover, there is provided a battery pack including: power source feeding means for feeding a power source; residual capacity holding means for holding the battery residual capacity of the power source feeding means; temperature measuring means for measuring the temperature of the power source feeding means; residual capacity correcting means for generating a correction quantity of the battery residual capacity on the basis of the temperature and the battery residual capacity, to feed the battery residual capacity corrected with the correction quantity; and communication means for outputting the battery residual capacity corrected by the residual capacity correcting means, to an electronic device. As a result, the correction considering the storage environment of the battery pack is executed, when the battery residual capacity is fed.

According to a third embodiment of the invention, moreover, there is provided a residual capacity information feeding method for a battery pack including residual capacity holding means for holding the battery residual capacity of a battery pack, and a unit correction quantity table for holding the correction quantity of the battery residual capacity per unit time, as a unit correction quantity, in accordance with a temperature in the battery pack and the battery residual capacity. The method includes the steps of: measuring a temperature in the battery pack; acquiring the unit correction quantity by referring to the unit correction quantity table on the basis of the temperature and the battery residual capacity; and correcting the battery residual capacity on the basis of the unit correction quantity. In this embodiment, there is also provided a program for causing a computer to execute the steps. As a result, the correction considering the storage environment of the battery pack is executed, when the battery residual capacity is fed.

According to the embodiments of the invention, there can be attained an excellent effect to make a correction taking the storage environment of a battery pack into account when the information on the battery residual capacity is to be fed.

BRIEF DESCRIPTION OF THE DRAWINGS

FIG. 4 is a table showing a configuration example of a unit correction quantity table 410 in the embodiment of the invention;

FIG. 5 is a diagram showing a configuration example of a normalized correction quantity table 420 in the embodiment of the invention.

DESCRIPTION OF THE PREFERRED EMBODIMENT

An embodiment of the invention is described in detail in the following with reference to the accompanying drawings.

Figure 1:
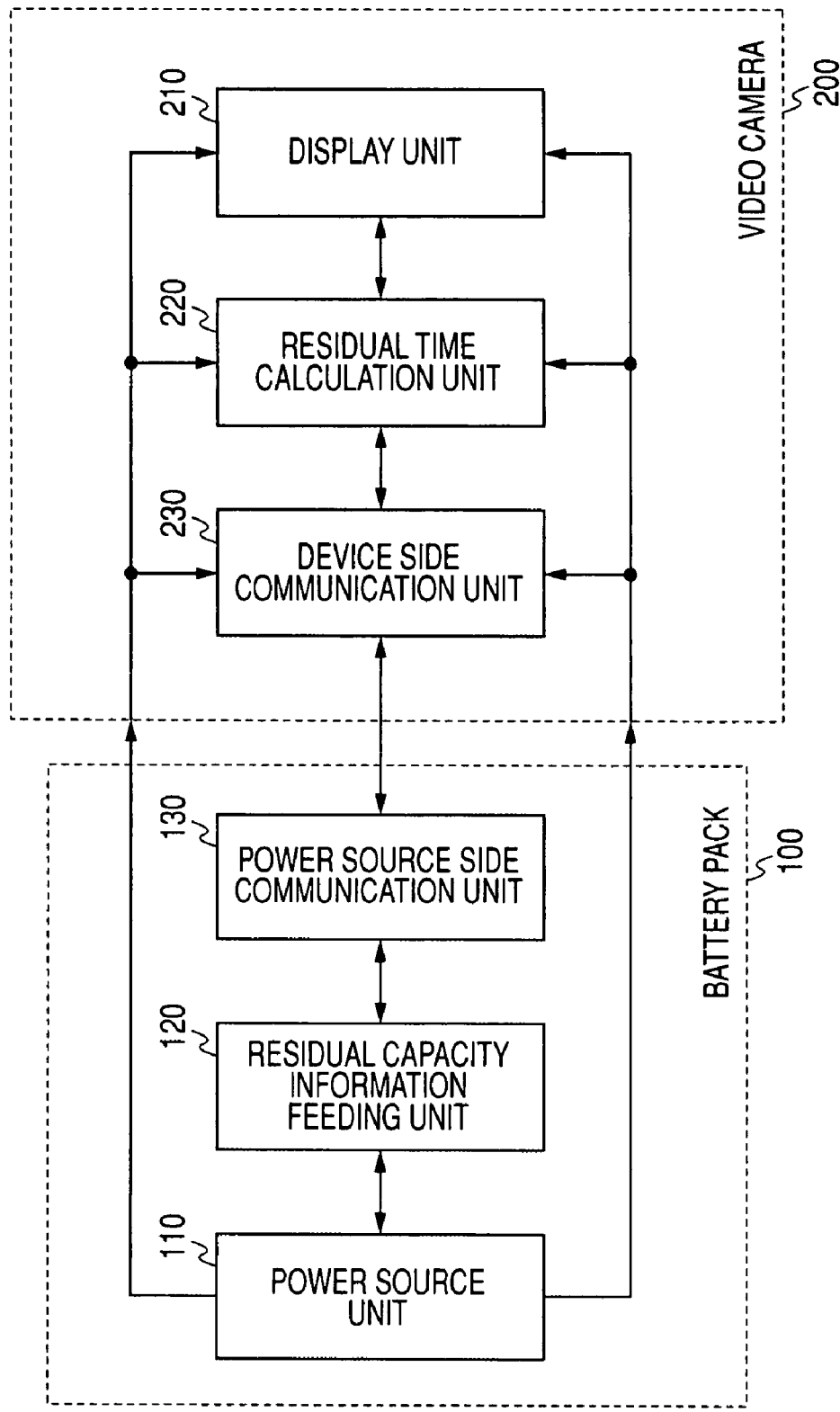
FIG. 1 is a diagram showing relations between a battery pack 100 and a video camera 200 in an embodiment of the invention.

FIG. 1 is a diagram showing relations between a battery pack 100 and a video camera 200 in an embodiment of the invention. The battery pack 100 is mounted, when used, in the video camera 200 thereby to feed an electric power. The video camera 200 is an example of an electronic device and is not especially limited so long as it is fed with the electric power by the battery pack 100.

The battery pack 100 is provided with a power source unit 110, a residual capacity information feeding unit 120 and a power source side communication unit 130. The power source unit 110 is a power source unit including a battery cell. The residual capacity information feeding unit 120 feeds information on the battery residual capacity (or the accumulated discharge current residue) in the power source unit 110. The power source side communication unit 130 communicates with the video camera 200.

The video camera 200 is provided with a display unit 210, a residual time calculation unit 220 and a device side communication unit 230. This device side communication unit 230 communicates with the battery pack 100, and receives information on the battery residual capacity. The residual time calculation unit 220 calculates, on the basis of information on the battery residual capacity, the residual time period of the battery, for which the video camera 200 can act. The display unit 210 displays a monitor image taken, and is realized by an LCD (Liquid Crystal Display), for example. In the display unit 210, moreover, the residual time period of the battery is displayed by an OSD (on-screen display) function, for example.

The accumulated quantity of the discharge current for the discharge time period of the battery pack 100 is substantially proportional to the time period, in case the discharge is made at a constant power consumption. In response to the accumulated discharge current quantity, the voltage and the current fed from the battery pack 100, and the parameters depending on the battery, the residual time calculation unit 220 calculates the consumed power from the voltage and the current, and calculates the residual time period till the battery terminals, on the basis of those pieces of information and the parameters depending on the video camera 200. Therefore, the accumulated quantity of the discharge current fed from the residual capacity information feeding unit 120 is demanded to have a high precision. In the embodiment of the invention, therefore, the residual capacity information feeding unit 120 of the battery pack 100 corrects the battery residual capacity according to the stored circumstance of the battery pack 100.

Figure 2:
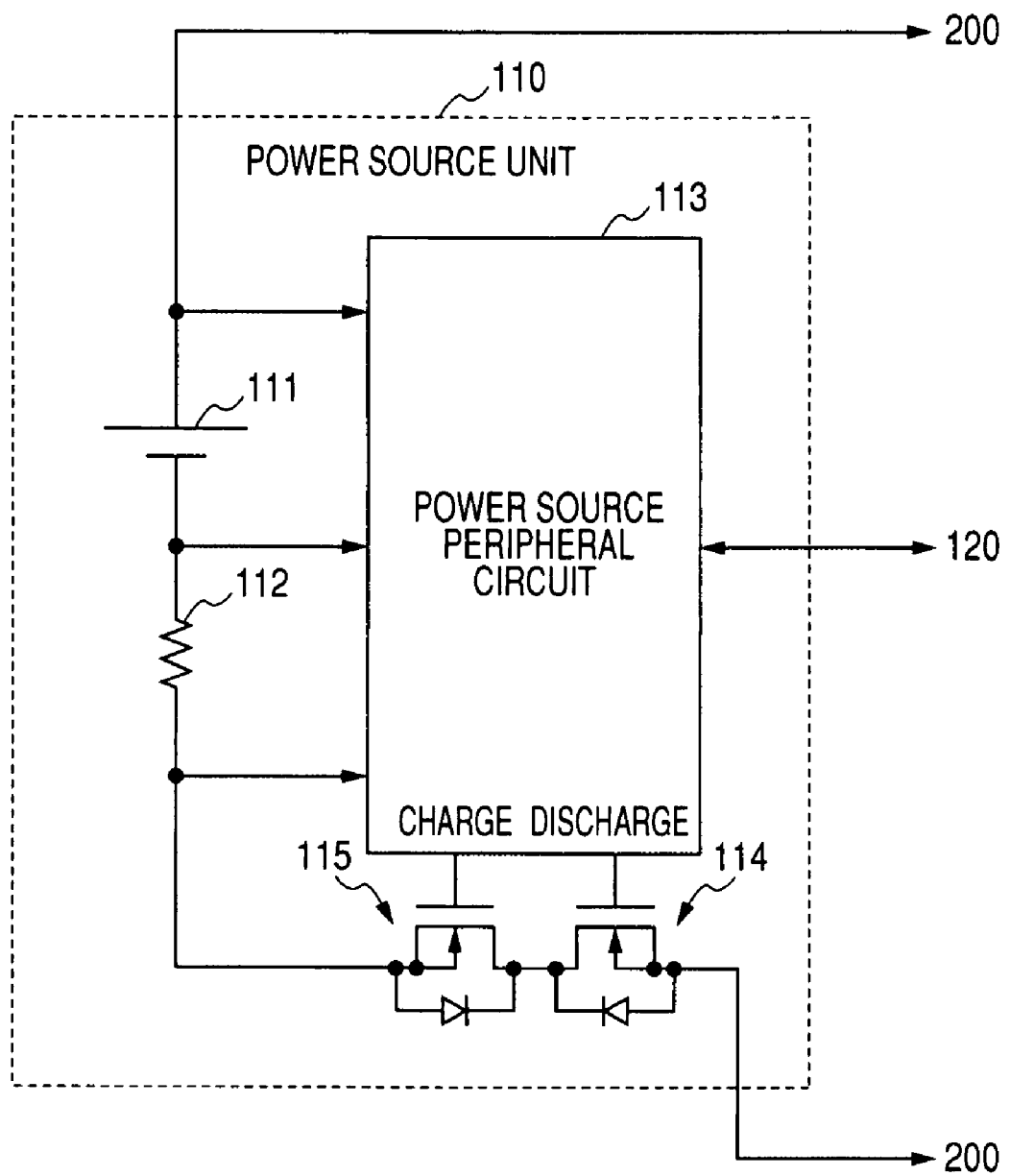
FIG. 2 is a diagram showing an example of a configuration of a power source unit 110 of the battery pack 100 in the embodiment of the invention.

FIG. 2 is a diagram showing an example of a configuration of the power source unit 110 of the battery pack 100 in the embodiment of the invention. This power source unit 110 is provided with a battery cell 111, a current detecting resistor 112, a power source peripheral circuit 113, and switches 114 and 115.

The battery cell 111 is a charging battery, as can be exemplified by a lithium ion cell, a nickel-cadmium cell, a nickel-hydrogen cell or a lithium polymer battery cell. The current detecting resistor 112, as connected with the negative side of the battery cell 111, is a resistor for detecting the electric current to flow through the battery cell 111.

The power source peripheral circuit 113 is mainly constituted of a voltage comparator (or a comparator), and has a function to detect the value of a charge/discharge current to flow through the current detecting resistor 112, and a function to protect the battery cell 111 against an overcharge, an overdischarge or an overcurrent.

The switch 114 is a charge control switch. When the voltage of the battery cell 111 exceeds a set value, the power source peripheral circuit 113 turns OFF the switch 114 to stop the charge thereby to prevent the overcharge. The switch 115 is a discharge control switch. When the voltage of the battery cell 111 falls short of a set value, the power source peripheral circuit 113 turns OFF the switch 115 to stop the discharge thereby to prevent the overdischarge. The switches 114 and 115 are individually realized by a power MOSFET (Metal Oxide Semiconductor Field Effect Transistor) and a diode.

Figure 3:
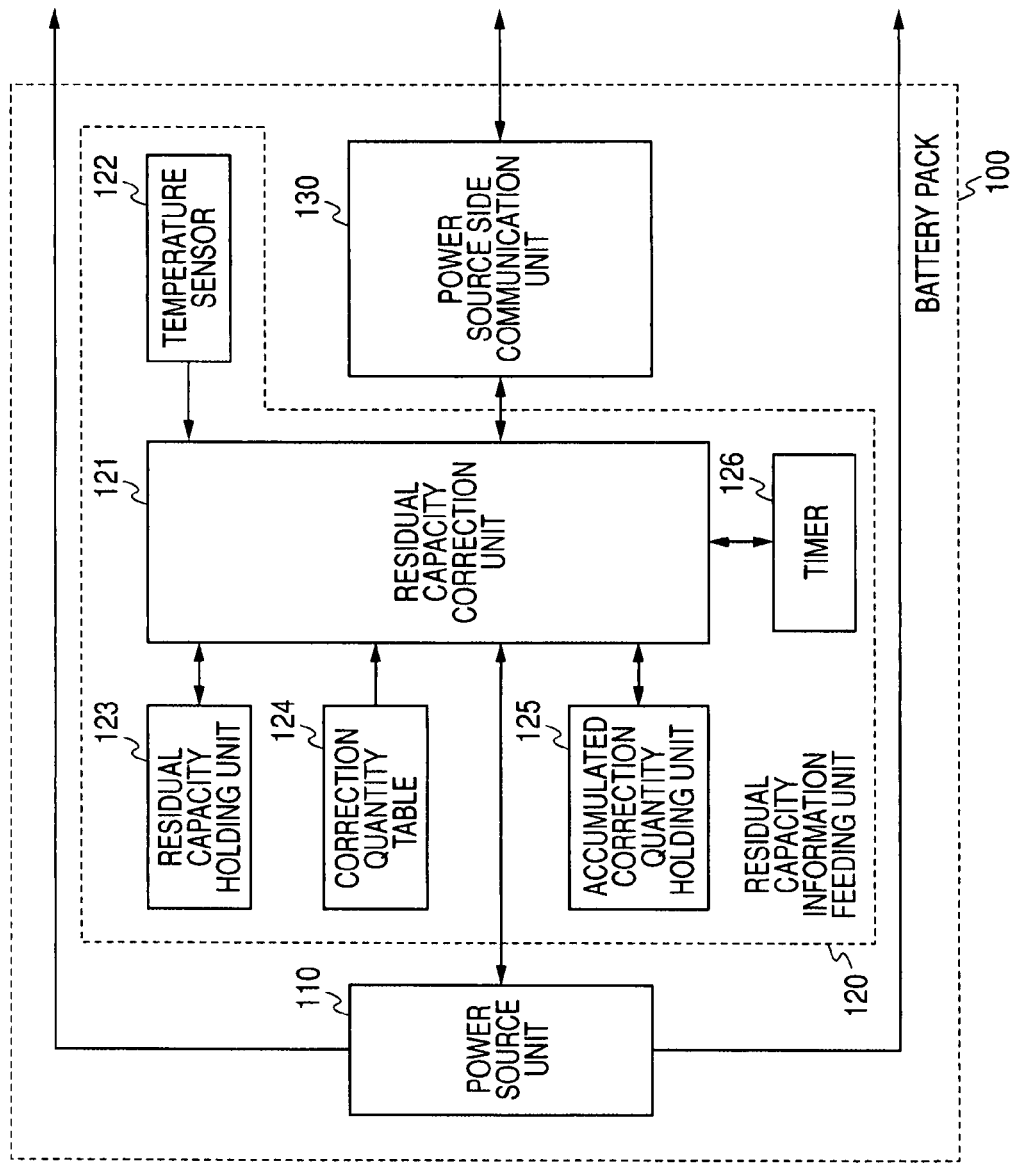
FIG. 3 is a diagram showing an example of a residual capacity information feeding unit 120 of the battery pack 100 in the embodiment of the invention.

FIG. 3 is a diagram showing an example of the residual capacity information feeding unit 120 of the battery pack 100 in the embodiment of the invention. The residual capacity information feeding unit 120 is provided with a residual capacity correction unit 121, a temperature sensor 122, a residual capacity holding unit 123, a correction quantity table 124, an accumulated correction quantity holding unit 125 and a timer 126.

The residual capacity correction unit 121 corrects the battery residual capacity in accordance with the storage environment of the battery pack 100, and is realized by a micro controller (as will be called the "micon") or an ASIC (Application Specific Integrated Circuit), for example. The temperature sensor 122 measures the temperature in the battery pack, and is realized by a thermistor, for example. This temperature sensor 122 is mounted on the surface of the battery cell 111 of the power source unit 110 or on the substrate in the vicinity. The residual capacity holding unit 123 holds the battery residual capacity before corrected by the residual capacity correction unit 121, and is realized by a nonvolatile memory such as an EEPROM (Electronically Erasable and Programmable Read Only Memory).

The correction quantity table 124 holds the correction quantity for correcting the battery residual capacity, and is realized by a nonvolatile memory such as the EEPROM. This correction quantity table 124 includes a unit correction quantity table 410 for holding unit correction quantities in accordance with the battery residual capacity and the temperature, and a normalized correction quantity table 420 for holding normalized correction quantities, as normalized according to the accumulated correction quantities of the unit correction quantities, according to the accumulated correction quantities, as will be described hereinafter.

The accumulated correction quantity holding unit 125 holds the accumulated correction quantity by adding the unit correction quantities acquired by the residual capacity correction unit 121, and is realized by a nonvolatile memory such as the EEPROM.

The timer 126 is aperiodic timer for measuring a sampling time period, and can be realized by a timer in the micron or a dedicated wake-up circuit. The sampling time period can be properly determined from about 1 second to about 1 hour, for example, according to the characteristics, the using modes or the like of the battery pack 100.

In accordance with the sampling time period measured by the timer 126, the residual capacity correction unit 121 acquires the temperature measured by the temperature sensor 122 and the battery residual capacity held in the residual capacity holding unit 123. Moreover, the residual capacity correction unit 121 acquires the unit correction quantity by referring to the unit correction quantity table 410 on the basis of the temperature and the battery residual capacity. The unit correction quantity thus acquired is added to the contents of the accumulated correction quantity holding unit 125.

Under a predetermined condition wherein the battery pack 100 is not feeding the video camera 200 with the electric power, the residual capacity correction unit 121 can shift to an idle (or sleep) state. Specifically, the residual capacity correction unit 121 stops the ordinary action when it is in the idle state, and releases the idle state, each time it is informed of the arrival of the sampling time period from the timer 126, thereby to perform the acquiring action of the aforementioned unit correction quantity. By using this action stopping state, only if necessary, to perform the acquiring action of the unit correction quantity, the power consumption of the battery pack 100 can be suppressed to the necessary minimum.

In case the battery pack 100 is connected with the video camera 200 to feed the electric power, the residual capacity correction unit 121 outputs the value, which calculated by subtracting the correction quantity held in the accumulated correction quantity holding unit 125 from the battery residual capacity held in the residual capacity holding unit 123, as the current battery residual capacity, to the video camera 200 through the power source side communication unit 130. At this time, moreover, it is arbitrary to use not the correction quantity held in the accumulated correction quantity holding unit 125, as it is, but the correction quantity normalized by the normalized correction quantity table 420, as will be described hereinafter.

FIG. 4 is a table showing a configuration example of the unit correction quantity table 410 in the embodiment of the invention. This unit correction quantity table 410 holds the correction quantities of battery residual capacities per unit time period as unit correction quantities, against the temperatures and the battery residual capacities, and is held in the correction quantity table 124.

It is known that a battery has its capacity reduced by its deterioration. In this embodiment of the invention, however, the rate of deterioration per unit time in the storage state, i.e., in the state, where the battery pack 100 is not used, is defined as the unit correction quantity, and is held in the unit correction quantity table 410.

The unit correction quantity can be determined according to the characteristics of the battery pack. The following items can be thought as indices for determining that unit correction quantity. It is enumerated as the first index that the deterioration rate has a tendency to grow the higher at the higher storage temperature, if the battery storage quantities at the storage time are equivalent. It is also enumerated as the second index that the deterioration rate has a tendency to grow the higher for the more battery residual capacity at the storage time the larger, if the storage temperatures are equivalent. If the storage temperatures are equivalent, therefore, the unit correction quantity grows the larger for the larger battery residual capacity at the storage time. If the battery residual capacities at the storage time are equivalent, the unit correction quantity grows the larger at the higher storage temperature.

In the example of FIG. 4, the battery residual capacity at the storage time is divided into two sections less than half and half or more of the total capacity, and the individual storage temperatures are divided into four sections of "60° C. OR HIGHER", "45° C. OR HIGHER AND LOWER THAN 60° C.", "25° C. OR HIGHER AND LOWER THAN 45° C." and "LOWER THAN 25° C.", thereby to determine the unit correction quantity. According to the aforementioned indices, this example is "UNIT CORRECTION QUANTITY D<UNIT CORRECTION QUANTITY C<UNIT CORRECTION QUANTITY B<UNIT CORRECTION QUANTITY A" and "UNIT CORRECTION QUANTITY H<UNIT CORRECTION QUANTITY G<UNIT CORRECTION QUANTITY F<UNIT CORRECTION QUANTITY E", and "UNIT CORRECTION QUANTITY A<UNIT CORRECTION QUANTITY E", "UNIT CORRECTION QUANTITY B<UNIT CORRECTION QUANTITY F", "UNIT CORRECTION QUANTITY C<UNIT CORRECTION QUAN- TITY G" and "UNIT CORRECTION QUANTITY D<UNIT CORRECTION QUANTITY H".

FIG. 5 is a diagram showing a configuration example of the normalized correction quantity table 420 in the embodiment of the invention. This normalized correction quantity table 420 is a table for holding the correction quantities, which are normalized from the battery residual capacities in accordance with the accumulated correction quantities, as the normalized correction quantities, and is held in the correction quantity table 124.

The unit correction quantities, as acquired from the unit correction quantity table 410, are accumulated as the accumulated correction quantities in the accumulated correction quantity holding unit 125. For correcting the battery residual capacities, it is possible to use the accumulated correction quantities as they are but to normalize the accumulated correction quantities stepwise and use them. The normalized correction quantity table 420 holds the normalized correction quantities thus normalized according to the accumulated correction quantities.

In the example of FIG. 5, for example: the correction quantity is a normalized correction quantity P, if the accumulated correction quantity is less than p; the correction quantity is a normalized correction quantity O, if the accumulated correction quantity is p or more and less than o; the correction quantity is a normalized correction quantity N, if the accumulated correction quantity is o or more and less than n; the correction quantity is a normalized correction quantity M, if the accumulated correction quantity is n or more and less than m; the correction quantity is a normalized correction quantity L, if the accumulated correction quantity is m or more and less than l; the correction quantity is a normalized correction quantity K, if the accumulated correction quantity is l or more and less than k; the correction quantity is a normalized correction quantity J, if the accumulated correction quantity is k or more and less than j; and the correction quantity is a normalized correction quantity I, if the accumulated correction quantity is j or more and less than i. Here, letters i to p individually designate real numbers.

The residual capacity correction unit 121 acquires the normalized correction quantity by referring to the normalized correction quantity table 420 on the basis of the accumulated correction quantity, and performs the correction by reducing the normalized correction quantity from the battery residual capacity held in the residual capacity holding unit 123.

Next, the actions of the battery pack 100 in the embodiment of the invention are described with reference to the drawing.

Figure 6:
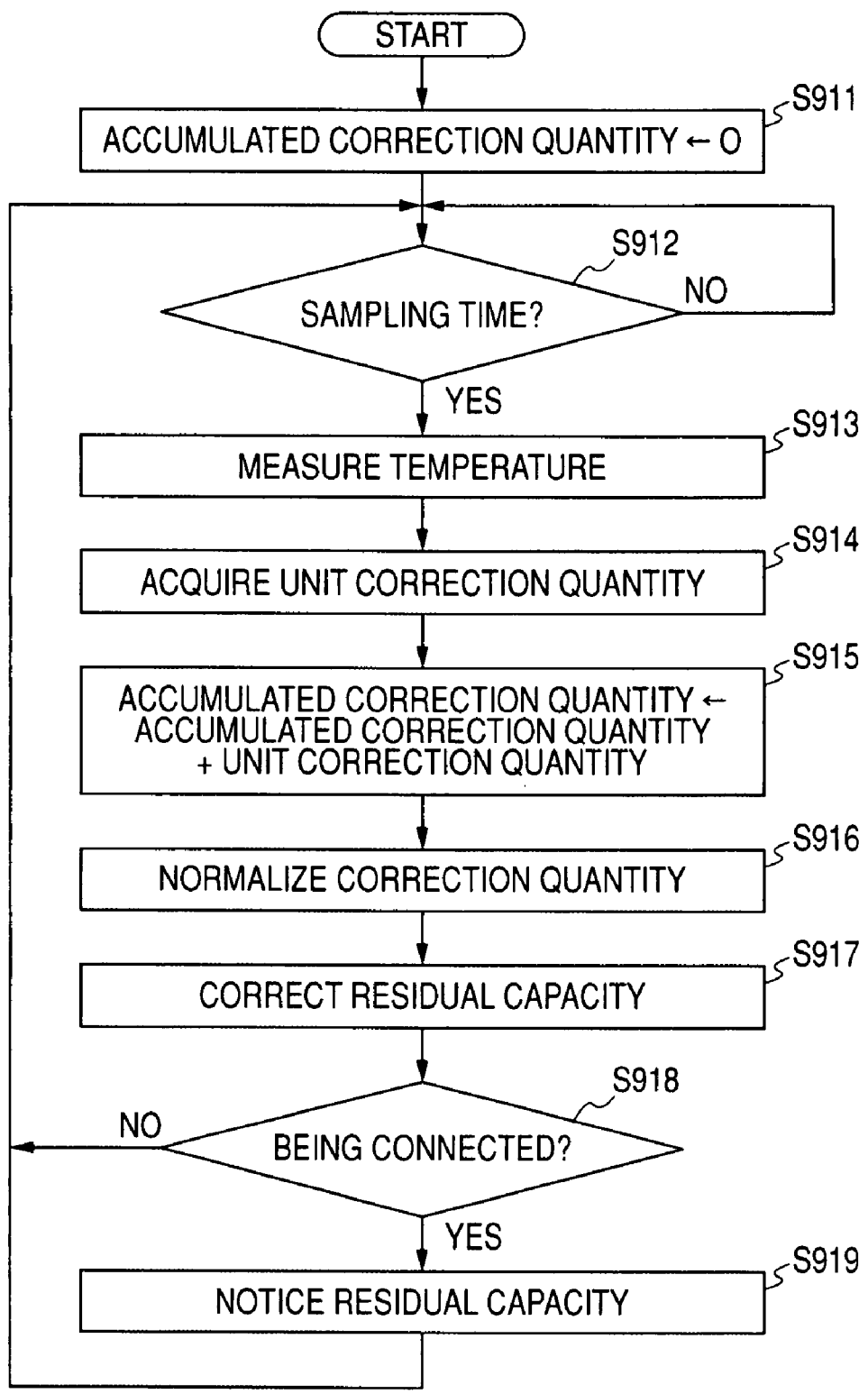
FIG. 6 is a chart showing a processing procedure example in the stored state of the battery pack 100 in the embodiment of the invention.

FIG. 6 is a chart showing a processing procedure example in the stored state of the battery pack 100 in the embodiment of the invention. First of all, the accumulated correction quantity held in the accumulated correction quantity holding unit 125 is initialized to zero (at Step S911). The following operations are performed each time the sampling time is measured (at Step S912) by the timer 126.

When the sampling time comes in, the temperature in the battery pack 100 is acquired (at Step S913) from the temperature sensor 122. The residual capacity correction unit 121 acquires the unit correction quantity (at Step S914) by referring to the unit correction quantity table 410 on the basis of the temperature acquired from the temperature sensor 122 and the battery residual capacity held in the residual capacity holding unit 123. This unit correction quantities are accumulated (at Step S915) as the accumulated correction quantity in the accumulated correction quantity holding unit 125.

At this time, the residual capacity correction unit 121 may normalize the accumulated correction quantities into the normalized correction quantity (at Step S916) by referring to the normalized correction quantity table 420 with the accumulated correction quantity.

Moreover, the residual capacity correction unit 121 corrects (at Step S917) the battery residual capacity held in the residual capacity holding unit 123, with either the accumulated correction quantity held in the accumulated correction quantity holding unit 125 or the normalized correction quantity. In case the battery pack 100 is connected (at Step S918) with an electronic device such as the video camera 200, the battery residual capacity thus corrected is outputted (at Step S919) to the side of the electronic device through the power source side communication unit 130.

Thus, according to the embodiment of the invention, the battery residual capacity according to the storage environment of the battery pack can be fed by accumulating the unit correction quantity, which is acquired by referring to the unit correction quantity table 410 with the storage temperature and the battery residual capacity, in the accumulated correction quantity holding unit 125, and by correcting the battery residual capacity on the basis of the accumulated correction quantity.

According to the embodiment of the invention, moreover, the power consumption of the battery pack 100 can be suppressed to the necessary minimum by shifting the residual capacity correction unit 121 into the idle state, and by releasing the idle state to acquire the unit correction quantity each time the arrival of the sampling time is notified from the timer 126.

Here, the embodiment of the invention presents one example for embodying the invention, and has the following relations individually corresponding to the invention defining items in claims. However, the invention should not be limited thereto, but can be modified in various manners within the scope not departing from the gist of the invention.

Specifically in the claims, residual capacity holding means corresponds to the residual capacity holding unit 123, for example. Moreover, temperature measuring means corresponds to the temperature sensor 122, for example.

Moreover, residual capacity correcting means corresponds to the residual capacity correction unit 121, for example.

In the claims, moreover, unit correction quantity table corresponds to the unit correction quantity table 410, for example.

In the claims, moreover, time measuring means corresponds to the timer 126, for example.

In the claims, moreover, accumulated correction quantity holding means corresponds to the accumulated correction quantity holding unit 125, for example. Moreover, a normalized correction quantity table corresponds to the normalized correction quantity table 420.

In the claims, moreover, power source feeding means corresponds to the power source unit 110, for example. Moreover, residual capacity holding means corresponds to the residual capacity holding unit 123, for example. Moreover, temperature measuring means corresponds to the temperature sensor 122, for example. Moreover, residual capacity correcting means corresponds to the residual capacity correction unit 121, for example. Moreover, communication means corresponds to power source side communication unit 130, for example.

In the claims, moreover, the step of measuring the temperature in the battery pack corresponds to Step S913, for example. Moreover, the step of acquiring a unit correction quantity by referring the unit correction quantity table on the basis of the temperature and the battery residual capacity corresponds to Step S914, for example. Moreover, the step of correcting the battery residual capacity on the basis of the unit correction quantity corresponds to the Step S917, for example.

Here, the processing procedures, as described in the embodiment of the invention, may be grasped as a method having those series procedures, a program for causing a computer to execute those series procedures, or a recording medium stored with that program.

It should be understood by those skilled in the art that various modifications, combinations, sub-combinations and alterations may occur depending on design requirements and other factors insofar as they are within the scope of the appended claims or the equivalents thereof.

What is claimed is:

1. A battery residual capacity information feeding device comprising:
    residual capacity holding means for holding a battery residual capacity of a battery pack;
    temperature measuring means for measuring a temperature in the battery pack;
    residual capacity correcting means for generating a correction quantity of the battery residual capacity on the basis of the temperature and the battery residual capacity, to feed the battery residual capacity corrected with the correction quantity;
    a unit correction quantity table for holding the correction quantity of the battery residual capacity per unit time in accordance with the temperature and the battery residual capacity, as a unit correction quantity; and
    time measuring means for measuring the unit time,
    wherein,
    the residual capacity correcting means acquires the unit correction quantity by referring to the unit correction quantity table on the basis of the temperature and the battery residual capacity, thereby to use the acquired unit correction quantity as the correction quantity of the battery residual capacity,
    the residual capacity correcting means performs the correction of the battery residual capacity each time the unit time is measured by the time measuring means, and
    the residual capacity correcting means shifts to an idle state under a predetermined condition and releases the idle state each time the unit time is measured by the time measuring means to perform the correction of the battery residual capacity.

2. A battery residual capacity information feeding device according to claim 1,
    wherein, in the unit correction quantity table, the unit correction quantity is the larger as the battery residual capacity is the higher, if the temperature is equivalent, whereas the unit correction quantity is the larger as the temperature is the higher, if the battery residual capacity is equivalent.

3. A battery residual capacity information feeding device according to claim 1, further comprising:
    accumulated correction quantity holding means for accumulating the unit correction quantities acquired by the residual capacity correcting means, to hold the accumulated unit correction quantities as an accumulated correction quantity; and
    a normalized correction quantity table for holding the normalized correction quantities of the battery residual capacities as the normalized correction quantity in accordance with the accumulated correction quantity,
    wherein the residual capacity correcting means acquires the normalized correction quantity by referring to the normalized correction quantity table on the basis of the accumulated correction quantity, to use the acquired normalized correction quantity as the correction quantity of the battery residual capacity.

4. A battery pack comprising:
    power source feeding means for feeding a power source;
    residual capacity holding means for holding a battery residual capacity of the power source feeding means;
    temperature measuring means for measuring the temperature of the power source feeding means;
    residual capacity correcting means for generating a correction quantity of the battery residual capacity on the basis of the temperature and the battery residual capacity, to feed the battery residual capacity corrected with the correction quantity;
    a unit correction quantity table for holding the correction quantity of the battery residual capacity per unit time in accordance with the temperature and the battery residual capacity, as a unit correction quantity;
    time measuring means for measuring the unit time; and
    communication means for outputting the battery residual capacity corrected by the residual capacity correcting means, to an electronic device,
    wherein,
    the residual capacity correcting means acquires the unit correction quantity by referring to the unit correction quantity table on the basis of the temperature and the battery residual capacity, thereby to use the acquired unit correction quantity as the correction quantity of the battery residual capacity,
    the residual capacity correcting means performs the correction of the battery residual capacity each time the unit time is measured by the time measuring means, and
    the residual capacity correcting means shifts to an idle state under a predetermined condition and releases the idle state each time the unit time is measured by the time measuring means to perform the correction of the battery residual capacity.

5. A computer-implemented method of feeding residual capacity information for a battery pack, the computer including a processor and memory and the method comprising steps performed by the computer of:
    holding, by the processor, a battery residual capacity of a battery pack;
    holding, by the processor, the correction quantity of the battery residual capacity per unit time, as a unit correction quantity, in accordance with a temperature in the battery pack and the battery residual capacity;
    measuring, by the processor, a temperature in the battery pack;
    measuring, by the processor, the unit time;
    acquiring, by the processor, the unit correction quantity by referring to the unit correction quantity table on the basis of the temperature and the battery residual capacity;
    shifting, by the processor, to an idle state under a predetermined condition;
    releasing, by the processor, the idle state each time the unit time is measured to perform the correction of the battery residual capacity;
    correcting, by the processor, the battery residual capacity on the basis of the unit correction quantity; and
    outputting, by the processor, the battery residual capacity to an electronic device.

6. A computer-readable recording medium storing a computer-executable program which, when executed by a processor, performs a method for feeding residual capacity information for a battery pack, the method comprising:

holding a battery residual capacity of a battery pack;

holding the correction quantity of the battery residual capacity per unit time, as a unit correction quantity, in accordance with a temperature in the battery pack and the battery residual capacity;

measuring a temperature in the battery pack;

measuring the unit time;

acquiring the unit correction quantity by referring to the unit correction quantity table on the basis of the temperature and the battery residual capacity;

shifting to an idle state under a predetermined condition;

releasing the idle state each time the unit time is measured to perform the correction of the battery residual capacity;

correcting the battery residual capacity on the basis of the unit correction quantity; and outputting the battery residual capacity to an electronic device.

7. A battery residual capacity information feeding device comprising:

a residual capacity holding unit configured to hold a battery residual capacity of a battery pack;

a temperature sensor configured to measure a temperature in the battery pack;

a residual capacity correction unit configured to generate a correction quantity of the battery residual capacity on the basis of the temperature and the battery residual capacity, to feed the battery residual capacity corrected with the correction quantity;

a unit correction quantity table configured to hold the correction quantity of the battery residual capacity per unit time in accordance with the temperature and the battery residual capacity, as a unit correction quantity; and a time measuring unit configured to measure the unit time, wherein, the residual capacity correction unit acquires the unit correction quantity by referring to the unit correction quantity table on the basis of the temperature and the battery residual capacity, thereby to use the acquired unit correction quantity as the correction quantity of the battery residual capacity, the residual capacity correction unit performs the correction of the battery residual capacity each time the unit time is measured by the time measuring means, and the residual capacity correction unit shifts to an idle state under a predetermined condition and releases the idle state each time the unit time is measured by the time measuring means to perform the correction of the battery residual capacity.

8. A battery pack comprising:

a power source unit configured to feed a power source;

a residual capacity holding unit configured to hold a battery residual capacity of the power source unit;

a temperature sensor configured to measure the temperature of the power source unit;

a residual capacity correction unit configured to generate a correction quantity of the battery residual capacity on the basis of the temperature and the battery residual capacity, to feed the battery residual capacity corrected with the correction quantity;

a unit correction quantity table configured to hold the correction quantity of the battery residual capacity per unit time in accordance with the temperature and the battery residual capacity, as a unit correction quantity;

a time measuring unit configured to measure the unit time; and a power source side communication unit configured to output the battery residual capacity corrected by the residual capacity correction unit, to an electronic device, wherein, the residual capacity correction unit acquires the unit correction quantity by referring to the unit correction quantity table on the basis of the temperature and the battery residual capacity, thereby to use the acquired unit correction quantity as the correction quantity of the battery residual capacity, the residual capacity correction unit performs the correction of the battery residual capacity each time the unit time is measured by the time measuring means, and the residual capacity correction unit shifts to an idle state under a predetermined condition and releases the idle state each time the unit time is measured by the time measuring means to perform the correction of the battery residual capacity.

* * * * *